United States Patent
Zhu

(10) Patent No.: US 8,451,012 B2
(45) Date of Patent: May 28, 2013

(54) CONTACT RESISTANCE TEST STRUCTURE AND METHOD SUITABLE FOR THREE-DIMENSIONAL INTEGRATED CIRCUITS

(75) Inventor: Huilong Zhu, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 551 days.

(21) Appl. No.: 12/699,206

(22) Filed: Feb. 3, 2010

(65) Prior Publication Data

US 2010/0207648 A1  Aug. 19, 2010

Related U.S. Application Data

(60) Provisional application No. 61/152,994, filed on Feb. 17, 2009.

(51) Int. Cl.
 *G01R 27/08* (2006.01)
(52) U.S. Cl.
 USPC ............ 324/691; 324/750.3; 438/14; 257/48; 257/734; 174/261
(58) Field of Classification Search
 USPC .................. 174/261; 324/691, 750.3; 257/48, 257/734, 773–777; 438/14–18
 See application file for complete search history.

(56) References Cited

U.S. PATENT DOCUMENTS

| | | | |
|---|---|---|---|
| 5,801,091 A * | 9/1998 | Efland et al. ................... | 438/622 |
| 6,373,007 B1 * | 4/2002 | Calcatera et al. ............. | 200/181 |
| 6,564,450 B2 * | 5/2003 | Engbring et al. ............... | 29/830 |
| 6,867,073 B1 * | 3/2005 | Enquist .......................... | 438/125 |
| 6,962,835 B2 * | 11/2005 | Tong et al. ..................... | 438/108 |
| 7,341,938 B2 * | 3/2008 | Enquist .......................... | 438/629 |
| 7,485,968 B2 * | 2/2009 | Enquist et al. ................ | 257/777 |
| 7,531,754 B2 * | 5/2009 | Yamashita et al. ............ | 174/254 |
| 7,714,446 B2 * | 5/2010 | Enquist .......................... | 257/774 |
| 2003/0109083 A1 * | 6/2003 | Ahmad .......................... | 438/125 |
| 2005/0181542 A1 * | 8/2005 | Enquist .......................... | 438/125 |
| 2007/0151756 A1 * | 7/2007 | Yamashita et al. ............ | 174/260 |
| 2009/0302392 A1 * | 12/2009 | Slesazeck ..................... | 257/369 |
| 2011/0042671 A1 * | 2/2011 | Walter ............................ | 257/48 |
| 2012/0025862 A1 * | 2/2012 | Chumakov et al. ....... | 324/762.01 |

* cited by examiner

*Primary Examiner* — Arleen M Vazquez
(74) *Attorney, Agent, or Firm* — Scully, Scott, Murphy & Presser, P.C.; H. Daniel Schnurmann

(57) ABSTRACT

A contact resistance test structure, a method for fabricating the contact resistance test structure and a method for measuring a contact resistance while using the contact resistance test structure are all predicated upon two parallel conductor lines (or multiples thereof) that are contacted by one perpendicular conductor line absent a via interposed there between. The test structure and related methods are applicable within the context of three-dimensional integrated circuits.

15 Claims, 11 Drawing Sheets

CONTACT RESISTANCE TEST STRUCTURE AND METHOD SUITABLE FOR THREE-DIMENSIONAL INTEGRATED CIRCUITS

This non-provisional application claims the benefit of the provisional application filed with the U.S. Patent and Trademark Office as Ser. No. 61/152,994 entitled "Contact Resistance Test Structure and Method Suitable for Three-Dimensional Integrated Circuits.

BACKGROUND

1. Field of the Invention

The invention relates generally to microelectronic structures. More particularly, the invention relates to contact resistance test structures within microelectronic structures.

2. Description of the Related Art

As microelectronic structures and microelectronic devices have decreased in aerial plan-view dimensions to a point where aerial linewidth dimensions are nearing physical limitations of metal oxide semiconductor field effect transistor (MOSFET) scaling and lithographic capabilities, a trend has recently evolved within microelectronic fabrication, and in particular within semiconductor fabrication, to utilize a third vertical dimension when fabricating microelectronic structures. The use of such a third vertical dimension provides three-dimensional integrated circuits.

Although such three-dimensional integrated circuits are desirable within the microelectronic fabrication and semiconductor fabrication arts, such three-dimensional integrated circuits are nonetheless not entirely without problems. In particular, it is desirable within such three-dimensional integrated circuits to assure that vertical electrical connections to successively vertically layered structures are electrically functional, and thus also have a desirably low contact resistance.

Contact resistance measurement structures that are applicable to three-dimensional circuits are known in the microelectronic fabrication and semiconductor fabrication arts.

For example, Chen et al., in "Contact Resistance Measurement of Bonded Copper Interconnects for Three-Dimensional Integration Technology," IEEE Electron Device Letters 2004, Digital Object Identifier 10.1109/LED.2003.821591, teaches a contact resistance test structure for use within bonded copper interconnects within three-dimensional integrated circuits. This particular contact resistance test structure comprises an overlapping X shaped test structure that is not susceptible to misalignment.

As microelectronic technology, including semiconductor technology, continues to advance, the evolution of three-dimensional integrated circuits is likely to continue to be prominent. Thus, desirable are test structures and related methods, such as but not limited to contact resistance test structures and related methods, that provide for efficient and reliable integration of three-dimensional integrated circuits.

SUMMARY

The invention provides a test structure for measuring a contact resistance within a three-dimensional integrated circuit, a method for fabricating the test structure for measuring the contact resistance within the three-dimensional integrated circuit and a method for measuring a contact resistance within the three dimensional integrated circuit while using the test structure. Each of the foregoing test structure and related methods is predicated upon a plurality of parallel conductor lines being crossed by and contacted by a single nominally perpendicular conductor line. By using the plurality of parallel conductor lines crossed by and contacted by the single perpendicular conductor line, this particular contact resistance test structure readily provides for a more precise contact resistance measurement due to an ability to consider parallel conductor line separation and perpendicular conductor line width dimensions when designing, fabricating and using the contact resistance test structure.

Within the embodiment and the invention, a "perpendicular" conductor line is intended to be perpendicular to the plurality of parallel conductor lines within the limitations of manufacturing tolerance, which is generally from +5 to −5 degrees of perpendicular (or +5 to −5 degrees of parallel for the plurality of parallel conductor lines).

A particular contact resistance test structure in accordance with the invention includes a substrate. The contact resistance test structure also includes at least two parallel conductor lines located co-planar over the substrate. The contact resistance test structure also includes at least one perpendicular conductor line located perpendicular to, non-planar with and contacting the at least two parallel conductor lines absent a via interposed between the perpendicular conductor line and either of the two parallel conductor lines.

A particular method for fabricating a contact resistance test structure in accordance with the invention includes providing a first substrate. The method also includes forming at least two parallel conductor lines planarized, exposed and embedded within a planarized dielectric layer over the first substrate. The method also includes providing a second substrate. The method also includes forming at least one conductor line planarized, exposed and embedded within a planarized dielectric layer over the second substrate. The method also includes laminating the first substrate and the second substrate so that the at least one conductor line over the second substrate perpendicularly crosses and contacts the at least two parallel conductor lines over the first substrate. The method also includes forming at least two conductor contacts through at least one of the first substrate and the second substrate to the at least two parallel conductor lines.

A particular method for measuring a contact resistance while using a test structure in accordance with the invention includes providing a first contact resistance test structure that includes: (1) a substrate; (2) at least two parallel conductor lines having a first separation S1 located co-planar over the substrate; and (3) at least one perpendicular conductor line having a first width W1 located perpendicular to, non-planar with and contacting the two parallel conductor lines absent a via interposed between the perpendicular conductor line and either of the two parallel conductor lines. The method also includes measuring a first resistance R1 through the first contact resistance test structure by contact to the two parallel conductor lines.

BRIEF DESCRIPTION OF THE DRAWINGS

The objects, features and advantages of the invention are understood within the context of the Description of the Preferred Embodiment, as set forth below. The Description of the Preferred Embodiment is understood within the context of the accompanying drawings that form a material part of this disclosure, wherein:

FIGS. 1A/B, 2A/B, 3A/B show first substrate etching when fabricating the microelectronic structure.

FIG. 11 shows contact pad formation with respect to FIGS. 10A/B/C.

FIG. 12 shows a final perspective-view of the contact resistance test structure.

DESCRIPTION OF THE PREFERRED EMBODIMENT

The invention, which includes a contact resistance test structure, a method for fabricating the contact resistance test structure and a method for using the contact resistance test structure, is understood within the context of the description set forth below. The description set forth below is understood within the context of the drawings described above. Since the drawings are intended for illustrative purposes, the drawings are not necessarily drawn to scale.

FIG. 1A to FIG. 12 show a series of schematic cross-sectional, plan-view and perspective-view diagrams illustrating the results of progressive stages in fabricating a contact resistance test structure within a three-dimensional integrated circuit structure (i.e., a microelectronic structure) in accordance with a particular embodiment of the invention. This particular embodiment of the invention comprises a particular sole preferred embodiment of the invention.

Figure 1A:
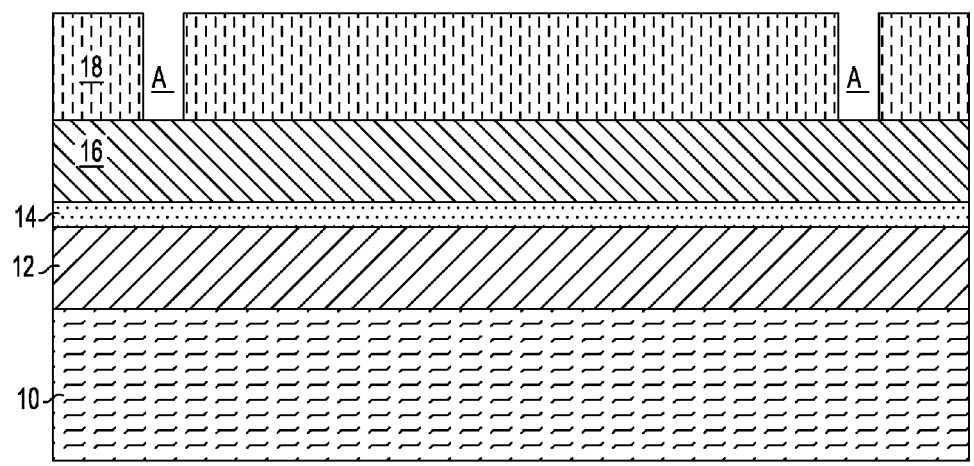
FIG. 1A to FIG. 12 shows a series of schematic cross-sectional, plan-view and perspective-view diagrams illustrating the results of progressive process steps in fabricating a microelectronic structure that comprises a three-dimensional integrated circuit that further includes a contact resistance test structure in accordance with a particular embodiment of the invention.
Figure 1B:
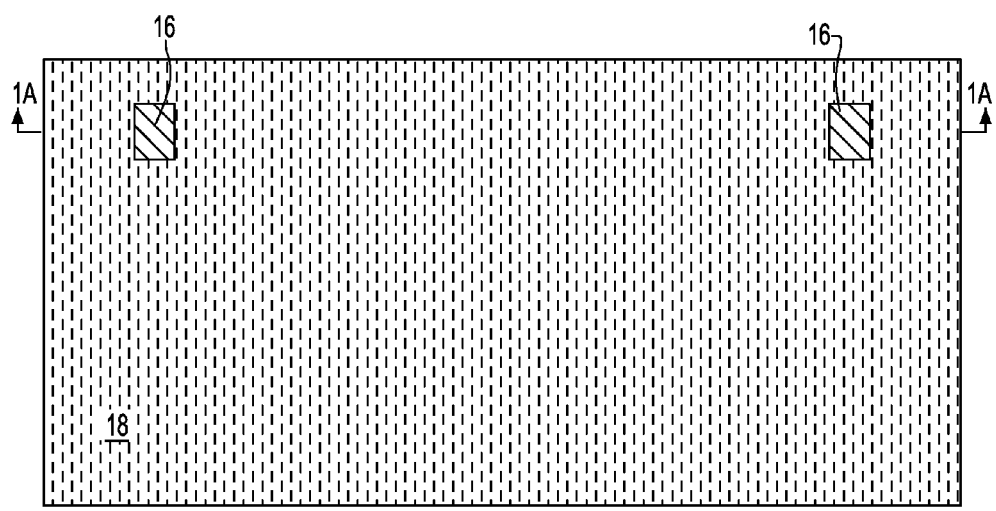

FIG. 1A and FIG. 1B show a schematic cross-sectional diagram and a schematic plan-view diagram of the microelectronic structure at an early stage in the fabrication thereof in accordance with this particular sole preferred embodiment.

FIG. 1 shows a first substrate 10. A first dielectric layer 12 is located and formed upon the first substrate 10. A stop layer 14 (i.e., intended as having etch stop properties, as well as planarizing stop properties, in accordance with the disclosure below) is located and formed upon the first dielectric layer 12. A second dielectric layer 16 is located and formed upon the stop layer 14. A first resist layer 18 that defines a plurality of apertures A that expose the second dielectric layer 16 is located and formed upon the second dielectric layer 16.

Each of the foregoing first substrate 10 and overlying layers 12, 14, 16 and 18 may comprise materials, have dimensions and be formed using methods that are otherwise generally conventional in the microelectronic fabrication art, including the semiconductor fabrication art.

For example, the first substrate 10 may comprise a material selected from the group including but not limited to conductor materials, semiconductor materials and dielectric materials. More particularly, the first substrate 10 comprises a semiconductor substrate. Such a semiconductor substrate may comprise any of several semiconductor materials. Non-limiting examples include silicon, germanium, silicon-germanium alloy, silicon-carbon alloy, silicon-germanium-carbon alloy and compound (i.e., III-V and II-VI) semiconductor materials. Non-limiting examples of compound semiconductor materials include gallium arsenide, indium arsenide and indium phosphide semiconductor materials. Typically, the first substrate 10 comprises a semiconductor substrate that has a generally conventional thickness.

Each of the first dielectric layer 12 and the second dielectric layer 16 may comprise any of several dielectric materials. Non-limiting examples include oxides, nitrides and oxynitrides, particularly of silicon, but oxides, nitrides and oxynitrides of other elements are not excluded. The first dielectric layer 12 and the second dielectric layer 16 may comprise the same or different dielectric materials, and may be formed using any of several methods. Non-limiting examples include ion implantation methods, thermal or plasma oxidation or nitridation methods, chemical vapor deposition methods and physical vapor deposition methods. Typically, each of the first dielectric layer 12 and the second dielectric layer 16 comprises a silicon oxide dielectric material formed to a thickness from 100 to 5000 nanometers.

The stop layer 14 typically comprises a hard mask material. In general hard mask materials may be selected from the same group of dielectric materials as the first dielectric layer 12 and the second dielectric layer 16. However, the stop layer 14 comprises a different material than the first dielectric layer 12 and the second dielectric layer 16 and thus the stop layer has a different relative etch rate characteristic in comparison with the first dielectric layer 12 and the second dielectric layer 16. Thus, and without limitation, when the first dielectric layer 12 and the second dielectric layer 16 comprise a silicon oxide dielectric material as is suggested above, the stop layer 14 typically comprises a silicon nitride material. Alternative materials combinations for the first dielectric layer 12, the stop layer 14 and the second dielectric layer 16 are also contemplated within the context of the instant embodiment. Typically, the stop layer 14 comprises such a silicon nitride material that has a thickness from 10 to 50 nanometers.

The first resist layer 18 may comprise any of several resist materials. Included in general are electron beam resist materials and photoresist materials. Also more particularly included are positive resist materials, negative resist materials and hybrid resist materials that have properties of both positive resist materials and negative resist materials. Typically, the resist layer 18 comprises a positive resist material or a negative resist material that has a thickness from 100 to about 600 nanometers, and defines the apertures A that have a linewidth from about 0.2 to 10 micrometers.

Figure 2A:
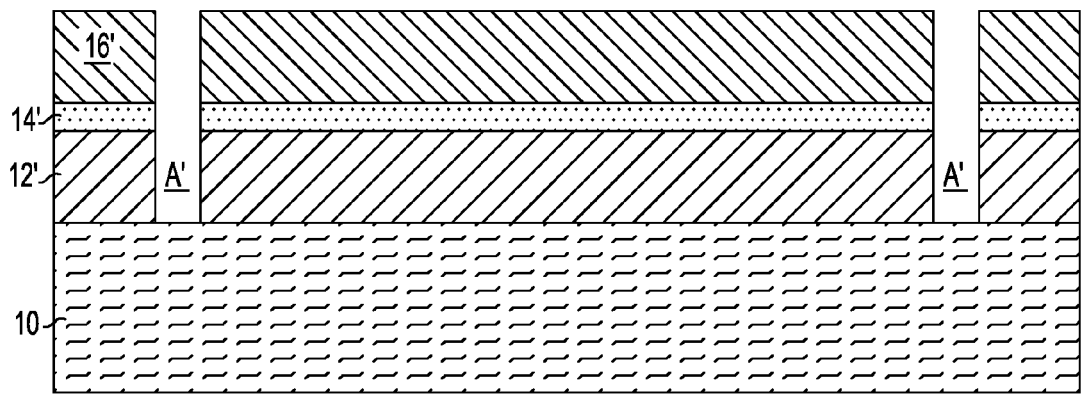
Figure 2B:
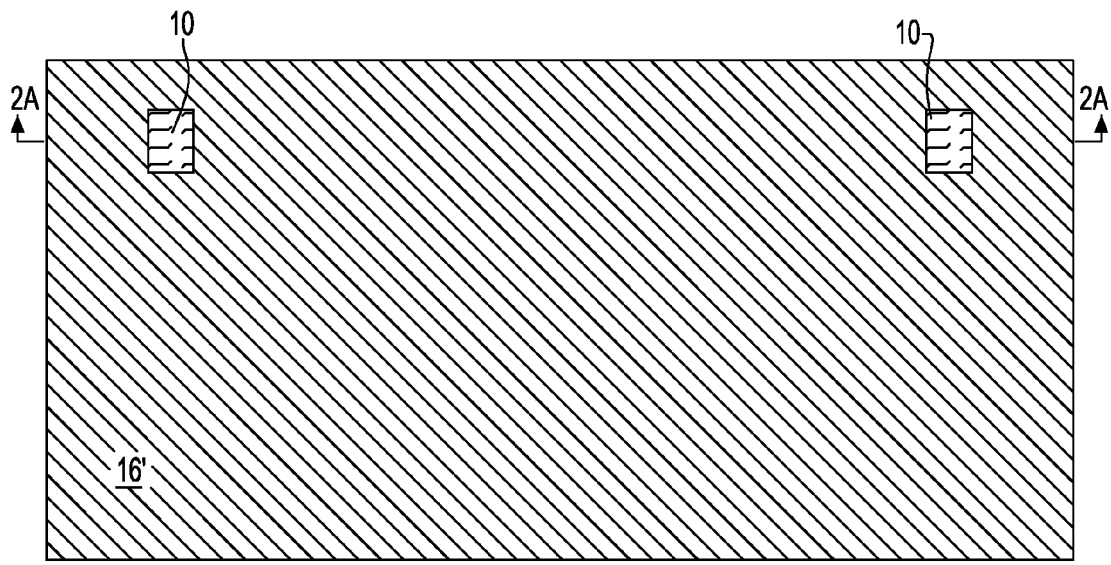

FIG. 2A and FIG. 2B show the results of etching through the second dielectric layer 16, the stop layer 14 and the first dielectric layer 12 to form a corresponding second dielectric layer 16', stop layer 14' and first dielectric layer 12' that expose the substrate 10 within a plurality of apertures A', and while using the first resist layer 18 as an etch mask. FIG. 2A and FIG. 2B also show the results of subsequently stripping the first resist layer 18 from the second dielectric layer 16' after having etched the apertures A' through the second dielectric layer 16, the stop layer 14 and the first dielectric layer 12.

The second dielectric layer 16, the stop layer 14 and the first dielectric layer 12 may be etched to form the second dielectric layer 16'; the stop layer 14' and the first dielectric layer 12' while using the first resist layer 18 as an etch mask layer, while using etch methods and etch materials that are otherwise generally conventional in the microelectronic fabrication art. Included in particular are wet chemical etch methods and materials, and dry plasma etch methods and materials. In accordance with this particular process step, as well as subsequent process steps within the context of this particular embodiment, dry plasma etch methods and materials are particularly desirable insofar as dry plasma etch methods and materials provide for generally straight sidewalls of etched layers such as the second dielectric layer 16', the stop layer 14' and the first dielectric layer 12'.

In addition, the first resist layer 18 may be stripped from the second dielectric layer 16' while using methods and materials that are also generally conventional in the microelectronic fabrication art. Included in particular are wet chemical stripping methods and materials, dry plasma stripping methods and materials, and combinations of wet chemical stripping methods and materials and dry plasma stripping methods and materials.

Figure 3A:
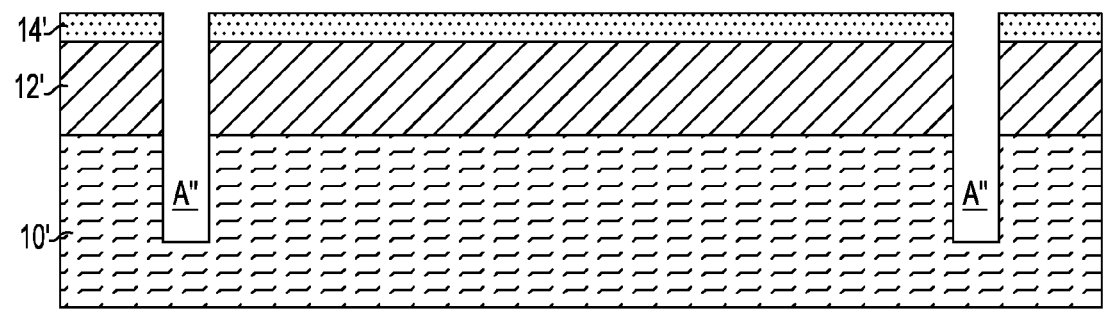
Figure 3B:
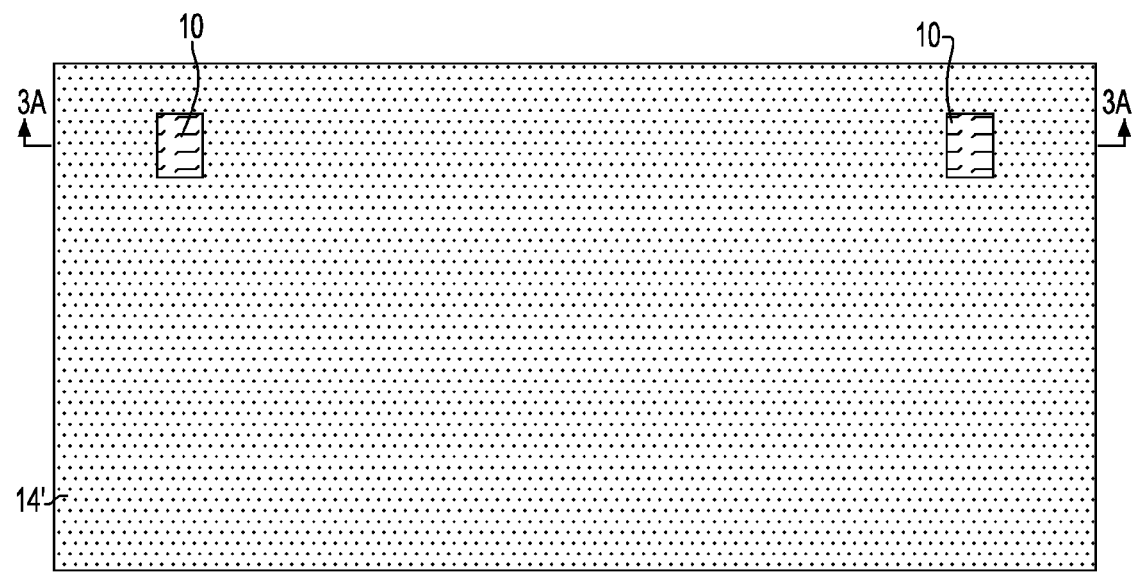

FIG. 3A and FIG. 3B first show the results of etching the substrate 10 to form a substrate 10' while using at least the stop layer 14' and the first dielectric layer 12' (and typically also the second dielectric layer 16') as an etch mask layer. FIG. 3A and FIG. 3B also show the results of stripping the second dielectric layer 16' from the stop layer 14'. Whether the second dielectric layer 16' is stripped before or after etching the substrate 10 to form the substrate 10', the second dielectric layer 16' may be stripped from the stop layer 14' while in particular using an anisotropic reactive ion etch method that does not provide an undercut of the first dielectric layer 12' with respect to the stop layer 14'.

Within FIG. 3A and FIG. 3B, the particular etching of the substrate 10 to form the substrate 10' also generally uses an anisotropic etch method that provides generally straight sidewalls of a plurality of apertures A'' that are now included within the substrate 10'.

Figure 4A:
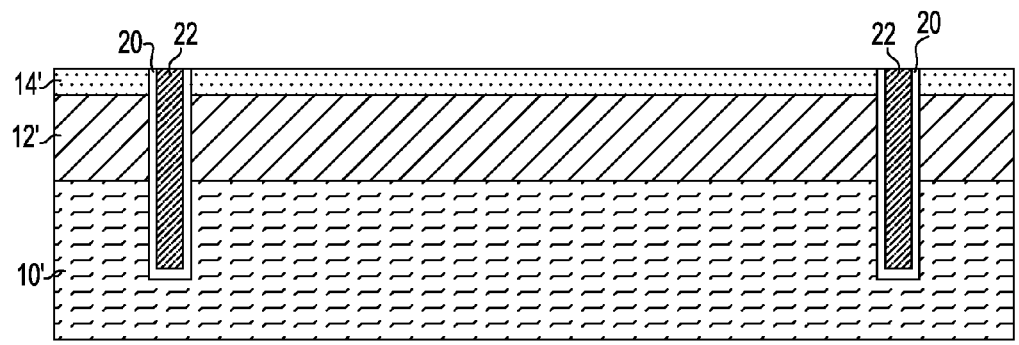
FIGS. 4A/B show via formation with respect to FIGS. 1A/B, 2A/B, 3A.
Figure 4B:
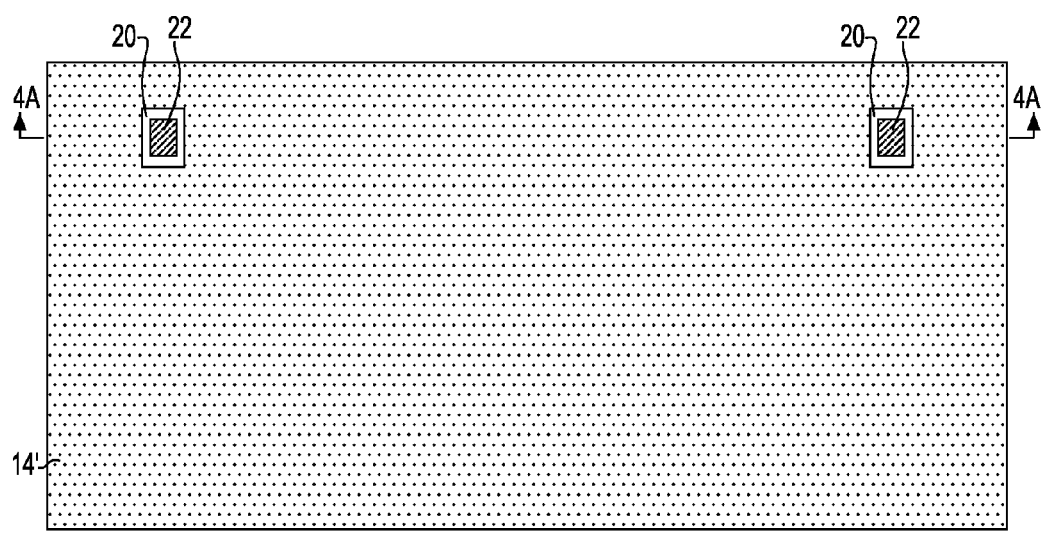

FIG. 4A and FIG. 4B first shows liner layers 20 located and formed conformally into each of the plurality of apertures A'' that is illustrated in FIG. 3A, while not completely filling each of the apertures A'' that is illustrated in FIG. 3A. FIG. 4A and FIG. 4B also show a plurality of first conductor layers 22 located and formed upon the liner layers 20 and completely filling the apertures A''.

The liner layers 20 typically comprise a dielectric liner material. The dielectric liner material will typically comprise a dielectric material selected from the same group of dielectric materials as the first dielectric layer 12' but not the same dielectric material as the stop layer 14'. Typically, the liner layers 20 are located and formed conformally incompletely filling the apertures A'', to a thickness from 10 to 500 nanometers.

The first conductor layers 22 may comprise any of several conductor materials, including, but not limited to certain metals, metal alloys, metal nitrides and metal silicides, as well as laminates thereof and composites thereof. The first conductor layers 22 may also comprise doped polysilicon and polysilicon-germanium alloy materials (i.e., having a dopant concentration from about 1e18 to about 1e22 dopant atoms per cubic centimeter) and polycide materials (doped polysilicon/metal silicide stack materials). Similarly, the foregoing materials may also be formed using any of several methods. Non-limiting examples include salicide methods, chemical vapor deposition methods and physical vapor deposition methods, such as, but not limited to evaporative methods and sputtering methods. Typically, the first conductor layers 22 comprise a metal conductor material, such as an aluminum, copper or tungsten metal conductor material, but most particularly a copper conductor material. Suitable barrier materials may also be included.

The liner layers 20 and the first conductor layers 22 are typically formed incident to a sequential blanket layer deposition and subsequent planarization of a precursor layer to the liner layers 20 and a precursor layer to the conductor layers 22. Particular planarizing methods may include, but are not necessarily limited to mechanical planarizing methods and chemical mechanical polish planarizing methods. Chemical mechanical polish planarizing methods are generally preferred.

Figure 5A:
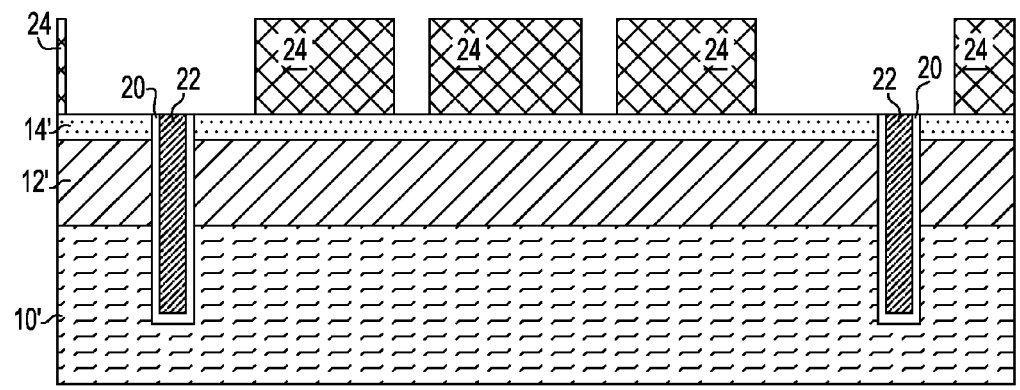
FIGS. 5A/B, 6, 7A/B show first conductor structure formation with respect to FIG. 4.
Figure 5B:
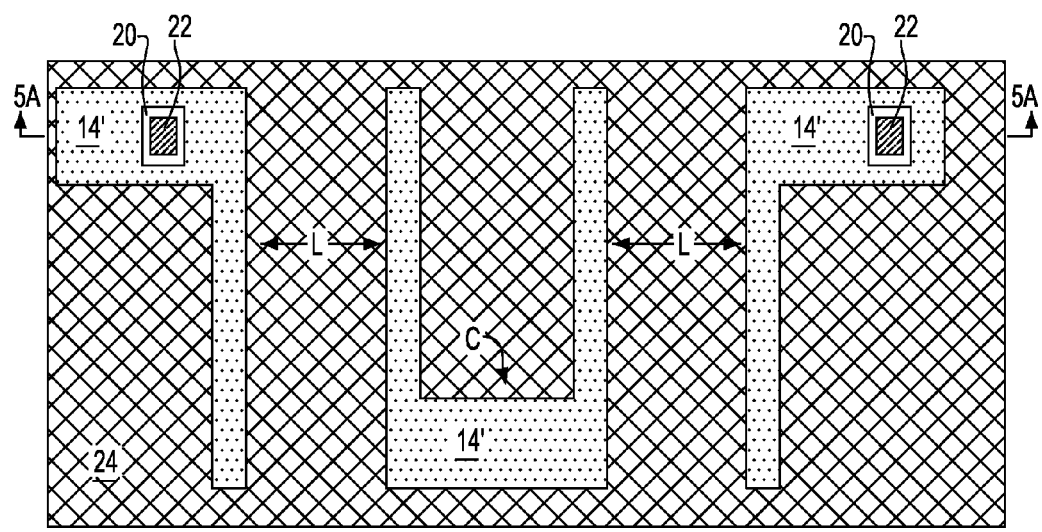

FIG. 5A and FIG. 5B illustrate a second resist layer 24 located and formed upon the stop layer 14' and leaving exposed portions of the stop layer 14', as well as the liner layers 20 and the first conductor layers 22.

The second resist layer 24 is otherwise analogous, equivalent or identical to the first resist 18 that is illustrated in FIG. 1, but rather includes a pattern that includes parallel lines L as open spaces, where a central two of the parallel lines L as open spaces are connected at one end by additional open space C.

Figure 6:
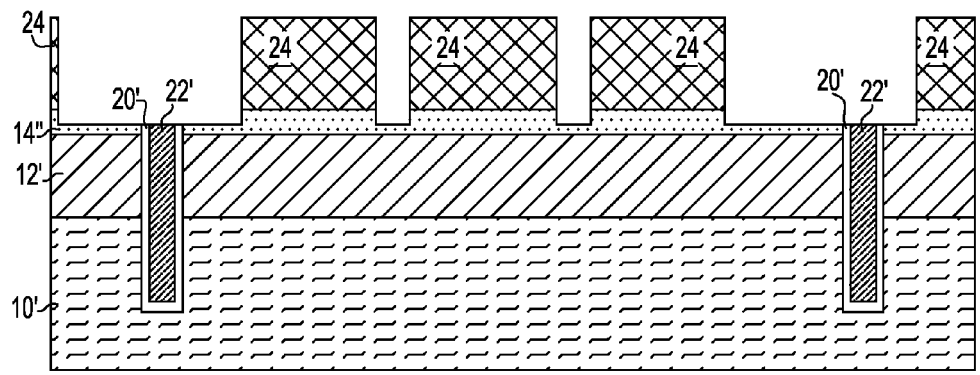

FIG. 6 shows the results of transferring the second resist layer 24 pattern into the stop layer 14' to provide a stop layer 14'' that is not completely etched, while also etching the liner layers 20 and the conductor layers 22 to form corresponding liner layers 20' and conductor layers 22'. As is illustrated in FIG. 6, this particular etching is also intended as an anisotropic etching.

Figure 7A:
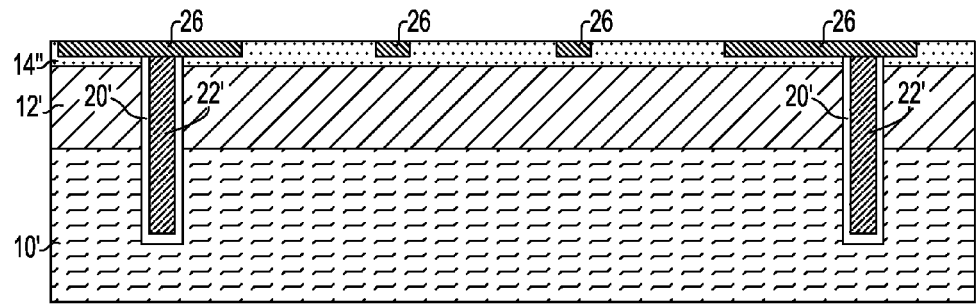
Figure 7B:
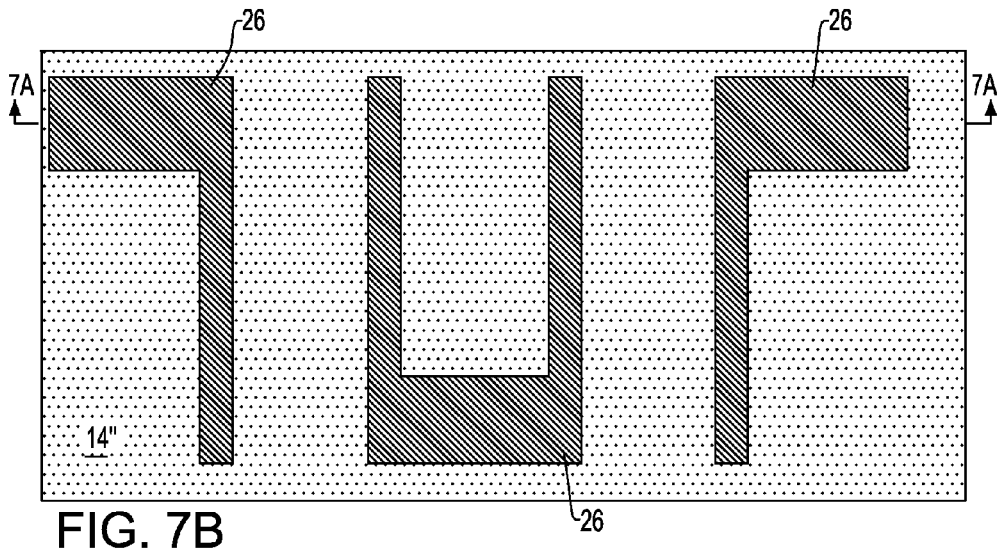

FIG. 7A and FIG. 7B first show the results of stripping the second resist layer 24 from the stop layer 14'' within the microelectronic structure whose schematic cross-sectional diagram is illustrated in FIG. 6. Such stripping of the second resist layer 24 from the stop layer 14'' within the microelectronic structure of FIG. 6 to provide in part the microelectronic structure of FIGS. 7A and 7B is otherwise analogous, equivalent or identical to the stripping of the first resist layer 18 from the microelectronic structure of FIG. 1A and FIG. 1B in-part when forming the microelectronic structure of FIGS. 2A and 2B.

FIG. 7A and FIG. 7B also show the results of forming and planarizing a second conductor layer 26 into the recesses within the stop layer 14'', after having stripped the second resist layer 24 from the stop layer 14''. The second conductor layer 26 may be formed using methods and materials analogous, equivalent or identical to the methods and materials that are used for forming the first conductor layer 22. In particular, such methods and materials include blanket layer deposition and planarizing methods that may be used to provide the second conductor layers 26 formed of a conductor material, such as but not limited to a metal conductor material, further such as but not limited to an aluminum, copper or tungsten conductor material, and most particularly a copper conductor material. Suitable barrier materials, such as but not limited to tantalum and titanium, as well as nitrides of tantalum, titanium and tungsten, may also be used. The second conductor layer 26 is intended to have a thickness from 0.100 to 10 micrometers, with each of the parallel lined sections of the second conductor layer having a linewidth from 0.1 to about 10 micrometers.

FIG. 7A and FIG. 7B show a first substrate 10' that is completely fabricated and finished to provide a planarized surface that includes a stop layer 14'' and four parallel conductor lines (a central two of which are connected) within a second conductor layer 26 that is embedded within the stop layer 14''.

Figure 8A:
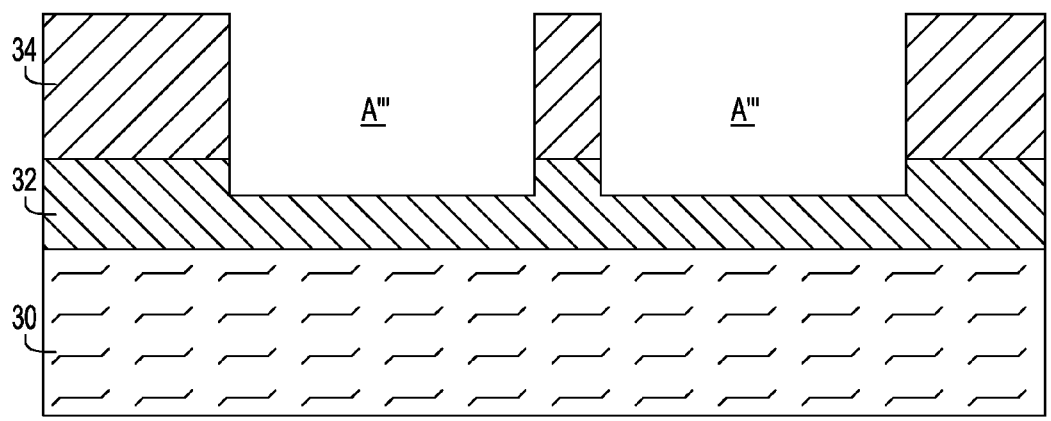
FIGS. 8A/B show second substrate etching with respect to FIGS. 5A/B, 6, 7A/B.
Figure 8B:
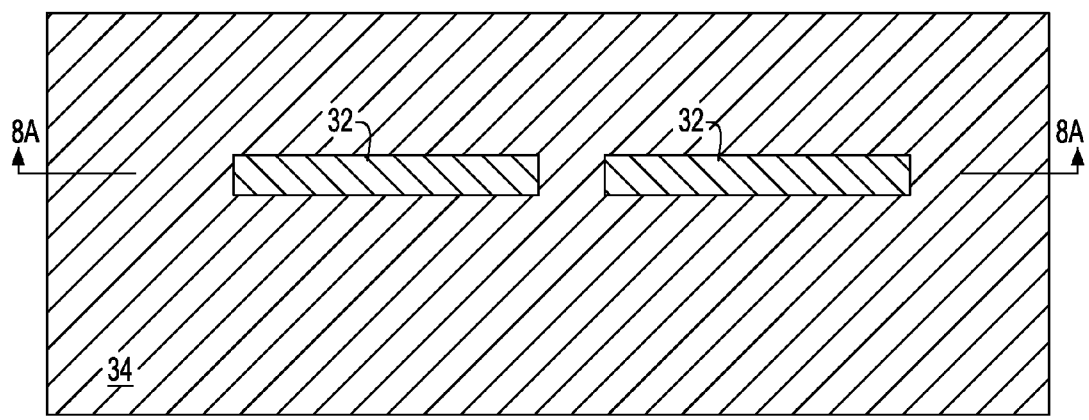

FIG. 8A and FIG. 8B show the results of an early stage in fabrication of a second substrate intended to be mated with the first substrate 10' that is illustrated in FIG. 7A and FIG. 7B to provide, at least in-part, a three-dimensional integrated circuit that includes a contact resistance test structure in accordance with the instant embodiment of the invention.

FIG. 8A and FIG. 8B show a second substrate 30. A third dielectric layer 32 is located and formed upon the second substrate 30. A third resist layer 34 is located and formed upon third dielectric layer 32.

Within the context of the microelectronic structures of FIG. 8A and FIG. 8B, the substrate 30 that is illustrated within FIG. 8A may comprise materials and have dimensions analogous, equivalent or identical to the substrate 10 that is illustrated in FIG. 1A. Typically, each of the substrate 10 that is illustrated in FIG. 1A and the substrate 30 that is illustrated in FIG. 8A includes a semiconductor substrate and more particularly a silicon semiconductor substrate.

Similarly, the third dielectric layer 32 may comprise dielectric materials, have dimensions and be formed using methods, analogous, equivalent or identical to the materials, dimensions and methods that are used within the context of the first dielectric layer 12 and the second dielectric layer 16 that are illustrated in FIG. 1A. Finally, the third resist 34 is otherwise generally analogous, equivalent or identical to the second resist layer 24 that is illustrated in FIG. 5A or FIG. 5B, or the first resist layer 18 that is illustrated in FIG. 1A and FIG. 1B.

FIG. 8A also shows a plurality of apertures A''' in-part within the third dielectric layer 32, where aerial dimensions of the apertures A''' correspond with the third resist 34. Such a correspondence is intended as indicative of etching a portion of the third dielectric layer 32 while using the third resist 34 as an etch mask.

Figure 9A:
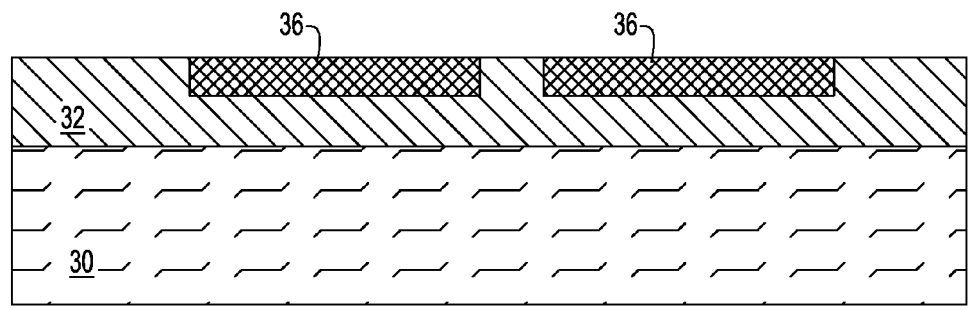
FIGS. 9A/B show second conductor structure formation with respect to FIGS. 8A/B.
Figure 9B:
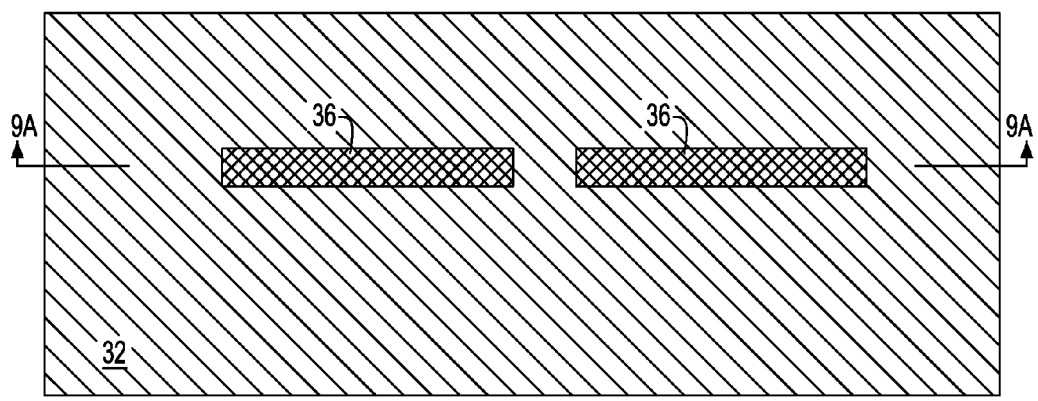

FIG. 9A and FIG. 9B first show the results of stripping the third resist layer 34 from the third dielectric layer 32. Such stripping may be effected using methods and materials that are described above with respect to stripping the second resist layer 24 from the stop layer 14'' and the first resist layer 18 from the second dielectric layer 16'.

FIG. 9A and FIG. 9B also show the results of forming and planarizing a plurality of third conductor layers 36 within the recesses within the third dielectric layer 32. These particular third conductor layers 36 may comprise materials, have dimensions and be formed using methods analogous, equivalent or identical to the materials, dimensions and methods used within the context of the second conductor layers 26 that are illustrated in FIG. 7A and FIG. 7B.

Preferably, the third conductor layers 36 comprise a copper conductor material, although neither the embodiment nor the invention is necessarily so limited.

Figure 10A:
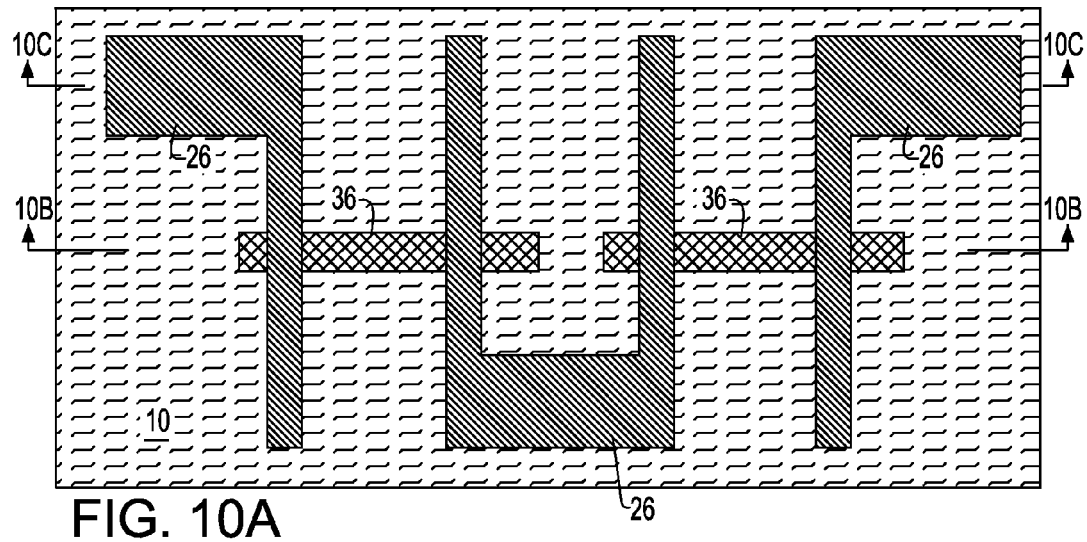
FIGS. 10A/B/C show lamination with respect to FIGS. 9A/B.
Figure 10B:
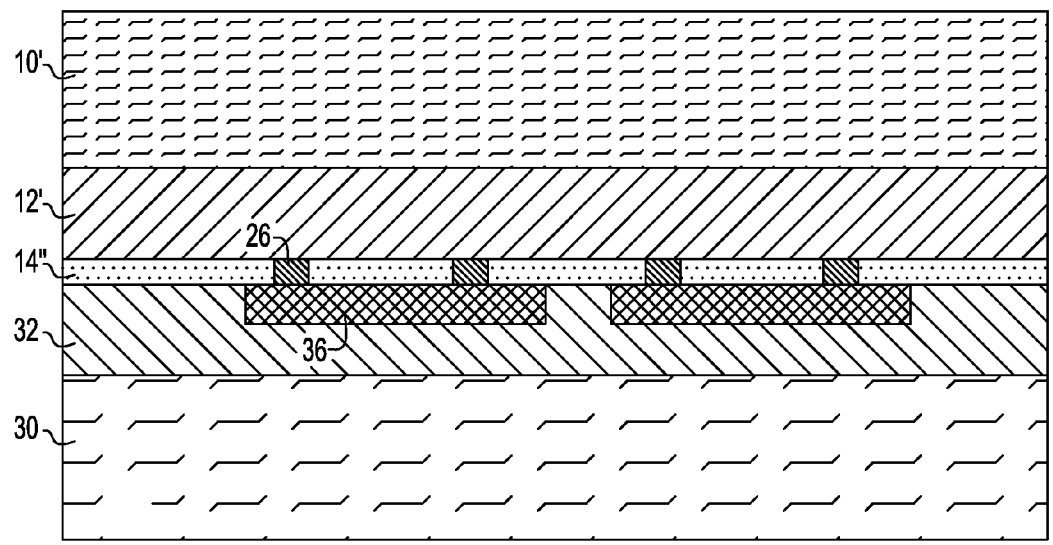
Figure 10C:
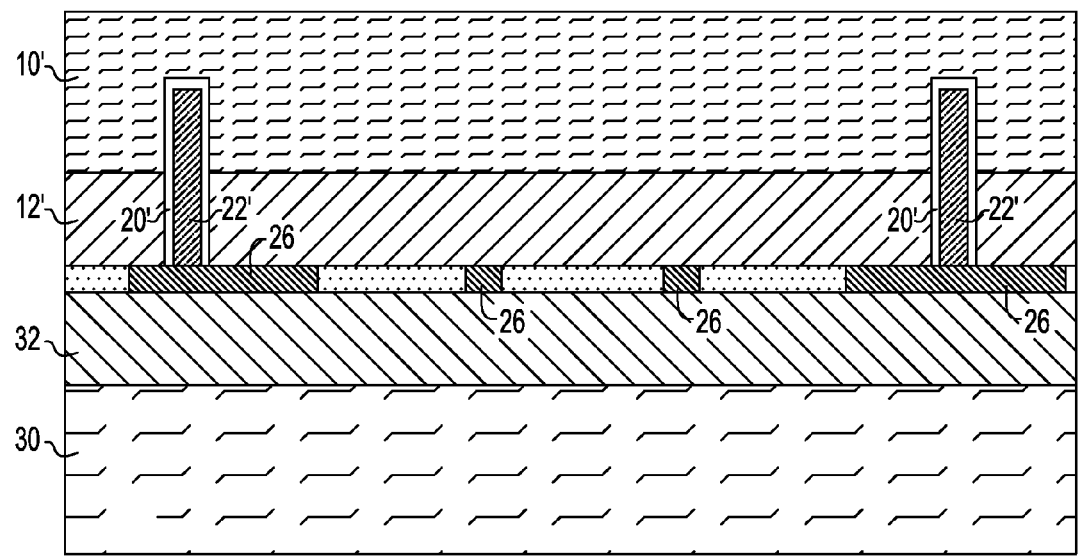

FIGS. 10A, 10B and 10C illustrate the results of laminating the embedded conductor layer surfaces of the substrate 10' that is illustrated in FIG. 7A and FIG. 7B with the substrate 30 that is illustrated in FIG. 9A and FIG. 9B. As is illustrated in particular within FIG. 10B, the third conductor layer 36 contacts the second conductor layer 26 absent a via interposed therebetween. The microelectronic structure of FIG. 7A and FIG. 7B may be laminated with the microelectronic structure of FIG. 9A and FIG. 9B while using laminating methods that are otherwise generally conventional in the microelectronic fabrication art for forming three-dimensional integrated circuits. Included in particular are pressure laminating methods, ultrasonic laminating methods and thermosonic laminating methods. Typically, the three-dimensional integrated circuit of FIGS. 10A, 10B and 10C results from a thermal and pressure assisted bonding of the microelectronic structure of FIG. 7A and FIG. 7B with the microelectronic structure of FIG. 9A and FIG. 9B at a temperature from 20 to 800 degrees centigrade and a pressure from 1 to 5 atmospheres pressure.

Figure 11:
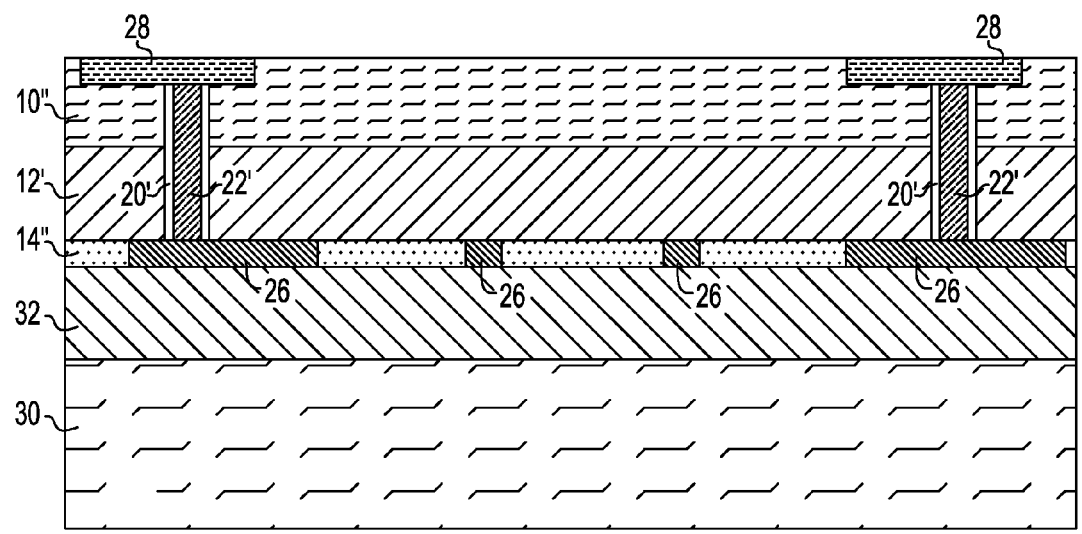

FIG. 11 first shows the results of etching the substrate 10' that is illustrated in FIG. 10C to provide a substrate 10'' that includes recesses that leave exposed end portions of the liner layers 20' and the first conductor layers 22' opposite the ends thereof that contact the second conductor layers 26. Such etching of the substrate 10' to provide the substrate 10'' that includes the recesses will typically include a masked etching of the substrate 10' while using an etchant that is appropriate to the material from which is comprised the substrate 10'.

Also contemplated within the microelectronic structure of FIG. 11 is that the substrate 10'' may also be thinned to in-part form the substrate 10'''. Such thinning may be effected using methods that are conventional in the microelectronic fabrication art. Included in particular, but also not limiting, are mechanical planarizing methods and chemical mechanical polish planarizing methods. Chemical mechanical polish planarizing methods are generally more common.

FIG. 11 also shows a plurality of fourth conductor layers 28 (i.e., contact pads) located and formed contacting the first conductor layers 22'. The fourth conductor layers 28 may comprise materials and be formed using methods analogous, equivalent or identical with the third conductor layers 36, the second conductor layers 26 and the first conductor layers 22'.

Figure 12:
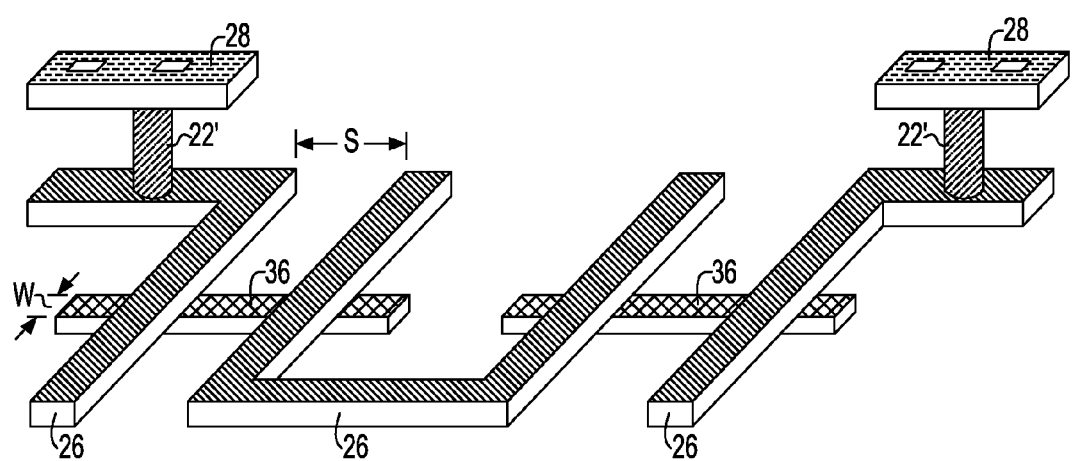

FIG. 12 shows a perspective-view diagram illustrating the disposition of first, second, third and fourth conductor layers 22', 26, 36 and 28 within the contact resistance test structure of the instant embodiment. FIG. 12 illustrates the fourth conductor layer 28 contact pads located connected to and contacting the first conductor layers 22' that form test structure vias to which contact may be directly made incident to in-line testing. FIG. 12 also shows the second conductor layers 26 that contact the first conductor layers 22' and the third conductor layers 36 that contact the second conductor layers 26 perpendicularly.

This particular embodiment also contemplates that a width W of a third conductor layers 36 may be varied to provide a first width W1 and a second width W2, and as well a separation distance S between adjacent second conductor layers 26 may also be varied to provide a first spacing S1 and a second spacing S2. One may then obtain three resistance measurements of the contact resistance test structure of the instant embodiment as follows: R1 at W1 and S1; R2 at W1 and S2; and R3 at W2 and S1.

Further:

$$R1 = n(Rb+2Rc)+Rt$$

$$R2 = n(RbS2/S1+2Rc)+Rt$$

$$R3 = n(Rb+2Rc)W1/W2+Rt$$

where:
n=number of third conductor layers 36
Rb=resistance of third conductor layer 36 between a pair of second conductor layers 26
Rc=contact resistance for a second conductor layer 26 and a third conductor layer 36
Rt=measured test structure resistance in a measured test structure chain that includes other than just Rb and Rc. In practice, Rt is kept constant for different measured test structure chains so that the values of (R2−R3) and (R1−R2) are independent with respect to Rt.

Thus:

$$Rc = [R2-R3-(R1-R2)(b-a)/a]/2nb$$

Where:

$$a = 1-S2/S1$$

$$b = 1-W1/W2$$

Therefore:

if $a=b=\frac{1}{2}$; then $Rc=(R2-R3)/n$

The preferred embodiment and example of the invention are illustrative of the invention rather than limiting of the invention. Revisions and modifications may be made to methods, materials, structures and dimensions of a contact resistance test structure in accordance with the preferred embodiment and example, while still providing a contact resistance test structure, a method for fabrication thereof and a method for use thereof in accordance with the invention, further in accordance with the accompanying claims.

What is claimed is:

1. A contact resistance test structure comprising:
    a substrate comprising at least one contact pad in direct contact with a portion of a conductive via, said at least one contact pad and said portion of said conductive via are both embedded within said substrate;
    at least two parallel conductor lines located co-planar beneath the substrate and embedded within an etch stop layer, wherein a surface of each of said two parallel conductor lines contacts an entire bottommost surface of said conductive via; and
    at least one perpendicular conductor line embedded within a dielectric layer and located perpendicular to, non-planar with and contacting the at least two parallel conductor lines absent a via interposed between the perpendicular conductor line and either of the two parallel conductor lines, and wherein said etch stop layer and said dielectric layer comprise a different dielectric material.

2. The text structure of claim 1 wherein the substrate comprises a semiconductor substrate.

3. The text structure of claim 1 wherein the two parallel conductor lines and the one perpendicular conductor line comprise the same conductor material.

4. The test structure of claim 1 wherein the two parallel conductor lines and the one perpendicular conductor line comprise different conductor materials.

5. The test structure of claim 1 wherein the two parallel conductor lines and the one perpendicular conductor line comprise a conductor material selected from the group consisting of aluminum, copper and tungsten conductor materials.

6. The test structure of claim 1 wherein the two parallel conductor lines and the one perpendicular conductor each have a linewidth from 0.1 to 10 micrometers.

7. The test structure of claim 1 further comprising:
    two additional parallel conductor lines to provide four parallel conductor lines, a central two of which are connected at one end; and
    one additional perpendicular conductor line to provide two perpendicular conductor lines each spanning and perpendicularly contacting adjacent and separated outer and inner parallel conductor lines.

8. The test structure of claim 1 further comprising a second substrate located beneath the at least one perpendicular conductor line.

9. The test structure of claim 1 further comprising another dielectric layer located between said substrate and said etch stop layer, wherein another portion of said conductive via is present within said another dielectric layer.

10. The test structure of claim 9 further comprising another dielectric layer located between said substrate and said etch stop layer, wherein another portion of said conductive via is present within said another dielectric layer and another dielectric liner material portion is present within said another dielectric layer.

11. The test structure of claim 1 wherein said at least one contact pad has an uppermost surface that is coplanar with an uppermost surface of said substrate.

12. The text structure of claim 1 further comprising a dielectric liner material portion located between said portion of said conductive via and said substrate.

13. The test structure of claim 1 wherein said etch stop layer comprises silicon nitride.

14. The test structure of claim 1 wherein said at least one contact pad comprises a same conductive material as said conductive via, said two parallel conductor lines and said one perpendicular conductor line.

15. The test structure of claim 1 wherein said at least one contact pad comprises a different conductive material as at least one of said conductive via, said two parallel conductor lines or said one perpendicular conductor line.

* * * * *